United States Patent [19]

Hasegawa et al.

[11] Patent Number: 4,791,387
[45] Date of Patent: Dec. 13, 1988

[54] MICROWAVE BAND FREQUENCY SYNTHESIZER

[75] Inventors: Makoto Hasegawa, Tokyo; Kouei Misaizu, Kawasaki; Mitsuo Makimoto, Yokohama, all of Japan

[73] Assignee: Matsushita Electric Industrial Co., Ltd., Osaka, Japan

[21] Appl. No.: 133,395

[22] Filed: Dec. 15, 1987

[30] Foreign Application Priority Data

Dec. 16, 1986 [JP] Japan .................. 61-299489
Dec. 16, 1986 [JP] Japan .................. 61-299490

[51] Int. Cl.$^4$ ............................................. H03L 7/06
[52] U.S. Cl. ......................................... 331/2; 331/16; 331/18; 331/46; 331/179
[58] Field of Search ............... 331/2, 16, 18, 22, 25, 331/30, 31, 46, 47, 48, 50, 74, 76, 77, 179; 455/260

[56] References Cited

U.S. PATENT DOCUMENTS 4,720,688 1/1988 Hasegawa et al. ............ 331/46 X

OTHER PUBLICATIONS

Ulrich, L., Rohde, Ph.D., Sc.D., "Digital PLL Frequency Synthesizers' Theory and Design", pp. 324–327.

Primary Examiner—Eugene R. LaRoche
Assistant Examiner—David Mis
Attorney, Agent, or Firm—Spencer & Frank

[57] ABSTRACT

A microwave band frequency synthesizer comprises first and second phase-locking loops. The first phase-locking loop includes a first voltage controlled oscillator, a variable frequency divider and a first multiplier and generates an output signal whose frequency changes at the rate of a unit frequency change width of the oscillator. The second phase-locking loop includes a first fixed frequency divider for frequency-dividing the output signal of the first phase-locking loop to provide a phase comparison reference signal of a frequency higher than that phase-compared in the first phase-locking loop, a second voltage controlled oscillator, a second fixed frequency divider for frequency dividing an output of the second voltage controlled oscillator, a second phase comparator for phase-comparing a frequency-divided an output signal of the second fixed frequency divider and the phase comparison reference signal in order for phase-locking of the second voltage controlled oscillator, and a second multiplier for multiplying the output signal from the second voltage controlled oscillator to provide a microwave band signal.

1 Claim, 4 Drawing Sheets

MICROWAVE BAND FREQUENCY SYNTHESIZER

BACKGROUND OF THE INVENTION

This invention relates to microwave band frequency synthesizers.

In recent years, a microwave band frequency synthesizer of low phase noise has been used extensively in the field of satellite communications and the like. The microwave band frequency synthesizer of a three-loop construction is known as disclosed in, for example, DIGITAL PLL FREQUENCY SYNTHESIZERS' Theory and design by Ulrich L. Rohde, Ph. D., Sc. D.

The known three-loop frequency synthesizer, however, uses three phase-locking loops operating at different variable frequencies, thus requiring three kinds of voltage controlled oscillators (VCO's) used in the three phase-locking loops and in addition, it faces a problem that the spurious characteristics are difficult to maintain.

SUMMARY OF THE INVENTION

This invention intends to solve the above prior art problems and has for its object to provide a structurally simplified, microwave band frequency synthesizer which can easily maintain the spurious characteristics to lower noise and which can confine the frequency prevailing in the circuit preceding the output multiplier stage within a pseudo-microwave band in which the circuit is easy to construct and the cable transmission loss is relatively small.

According to one aspect of the invention, there is provided a microwave band frequency synthesizer comprising a first phase-locking loop including a first voltage controlled oscillator, a variable frequency divider, a first multiplier, a first mixing subtracter for performing mixing subtraction of an output signal of the first multiplier and an output signal of a multiplied reference signal source, and a first comparator, whereby the first phase-locking loop delivers an output signal whose frequency changes with a variable frequency division coefficient of the variable frequency divider at the rate of a unit frequency change width; a second phase-locking loop including a first fixed frequency divider for performing fixed frequency division of the output signal of the first phase-locking loop to provide a phase comparison reference signal of a frequency higher than that of a reference signal for the first phase comparator, a second voltage controlled oscillator whose output signal is subjected to mixing subtraction with an output signal of a fixed phase-locked oscillator, a second fixed frequency divider for performing fixed frequency division of the mixed and subtracted signal, a second phase comparator for performing phase comparison between an output signal of the second fixed frequency divider and the phase comparison reference signal so as to provide a signal used for making the second voltage controlled oscillator phase locked; and a second multiplier for multiplying the output signal of the second voltage controlled oscillator so as to provide a microwave band signal.

According to another aspect of the invention, there is provided a microwave band frequency synthesizer comprising a first phase-locking loop including a first voltage controlled oscillator, a variable frequency divider, a first multiplier and a first phase comparator having a comparison frequency which is raised to a value being a multiplying coefficient of the first multiplier times a frequency change width of the first voltage controlled oscillator which takes place when a frequency division coefficient of the variable frequency divider changes by one, whereby the first phase-locking loop delivers an output signal whose frequency changes at the rate of a unit frequency change width of the first voltage controlled oscillator; a second phase-locking loop including a first fixed frequency divider for performing fixed frequency division of the output signal of the first phase-locking loop to provide a phase comparison reference signal higher than the comparison frequency of the first phase comparator, a second voltage controlled oscillator whose output signal is subjected to fixed frequency division at a second fixed frequency divider, and a second phase comparator for performing phase comparison between an output signal of the second fixed frequency divider and the phase comparison reference signal so as to provide a signal used for making the second voltage controlled oscillator phase locked; a mixing adder for performing mixing addition of the output signal of the second voltage controlled oscillator and an output signal of a fixed phase-locked oscillator; and a second multiplier for multiplying an output signal of the mixing adder so as to provide a microwave band signal.

DESCRIPTION OF THE PREFERRED EMBODIMENTS

A first embodiment of the invention will now be described with reference to the accompanying drawings.

Figure 1:
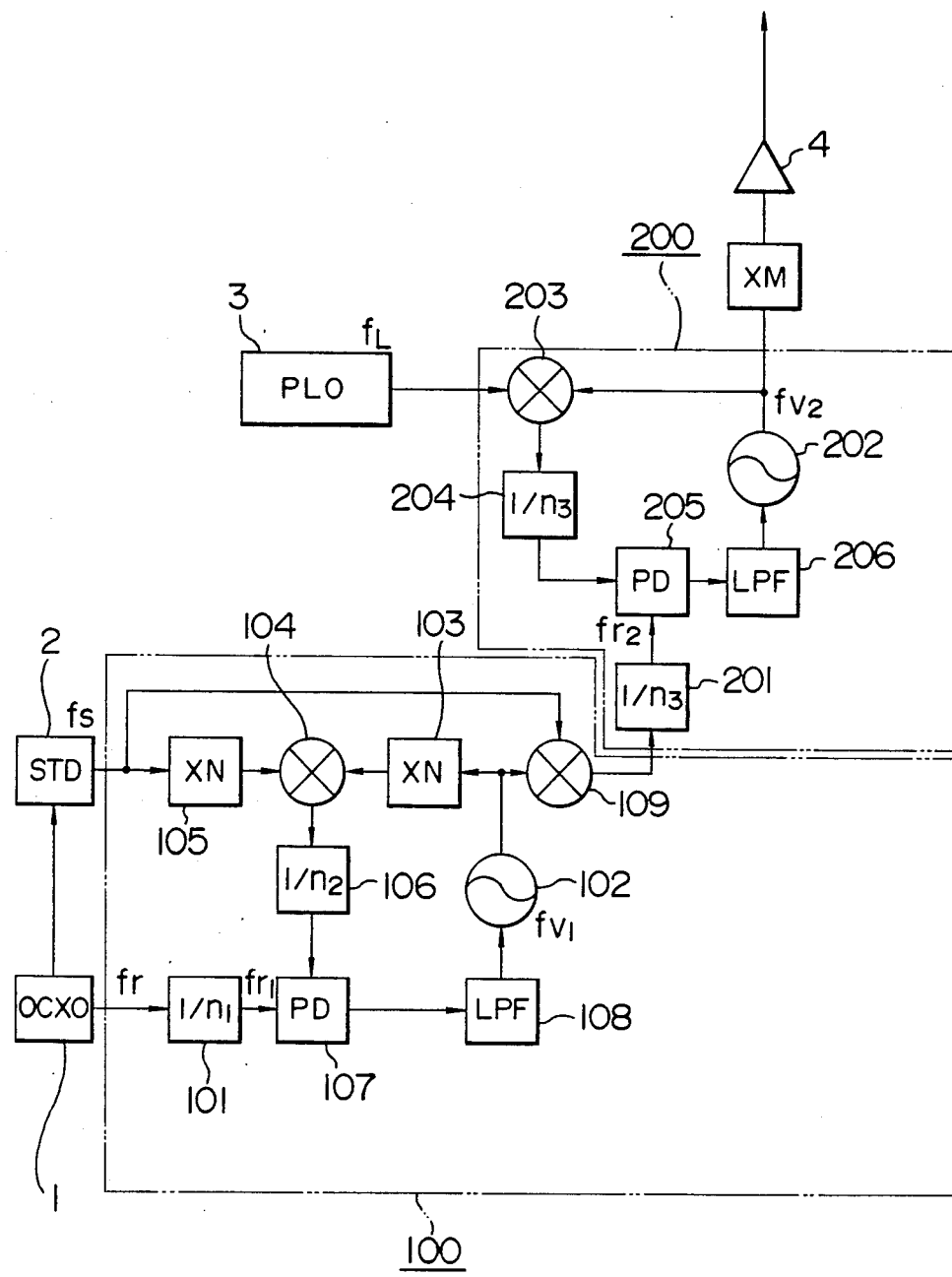
FIGS. 1 to 3 are schematic circuit diagrams showing microwave band frequency synthesizers according to first to third embodiments of the invention.

FIG. 1 is a schematic circuit diagram illustrating a microwave band frequency synthesizer according to the first embodiment of the invention. As shown in FIG. 1, the microwave band frequency synthesizer basically comprises a highly stable reference crystal oscillator 1, a multiplied reference signal source 2 adapted to multiply a reference signal of the reference crystal oscillator 1, a fixed phase-locked oscillator 3 operative to generate an oscillation signal of fixed phase, a first phase-locking loop 100, a second phase-locking loop 200, and a multiplier 4 adapted to M multiply an output signal of the second phase-locking loop 200.

In particular, the first phase-locking loop 100 includes a fixed frequency divider 101 for performing fixed frequency division by $1/n_1$ of a reference signal delivered out of the reference crystal oscillator 1, a voltage controlled oscillator 102 operative to generate an oscillation signal in accordance with a control potential of a loop filter 108 to be described later, a multiplier 103 adapted to N multiply the oscillation frequency of the output signal of the voltage controlled oscillator 102, a mixing subtracter 104 for performing mixing subtraction of an output signal of a multiplier 105, adapted to N multiply an output signal of the multiplied reference signal source 2, and an output signal of the multiplier 103, a variable frequency divider 106 for performing variable frequency division by $1/n_2$ of an output signal of the mixing subtracter 104, a phase comparator 107 for performing phase comparison between output signals of the fixed frequency divider 101 and variable frequency divider 106, and a mixing subtracter 109 for performing mixing subtraction of the output signals of the voltage controlled oscillator 102 and multiplied reference signal source 2. The loop filter 108 included in the first phase-locking loop 100 is responsive to an output signal of the phase comparator 107 to control the oscillation of the voltage controlled oscillator 102. The mixing substructer 109 performs mixing subtraction of the output of the voltage controlled oscillator 102 and the output of the multiplied reference signal source 2. The second phase-locking loop 200, on the other hand, includes a fixed frequency divider 201 for performing fixed frequency division by $1/n_3$ of an output signal of the mixing subtracter 109 included in the first phase-locking loop 100, a voltage controlled oscillator 202 operative to generate an oscillation signal in accordance with a control signal of a loop filter 206 to be described later, a mixing subtracter 203 for performing mixing subtraction of the output signals of the voltage controlled oscillator 202 and fixed-phase locked oscillator 3, a fixed frequency divider 204 for performing fixed frequency division by $1/n_3$ of an output signal of the mixing subtracter 203, and a phase comparator 205 for performing phase comparison between output signals of the fixed frequency dividers 201 and 204. The loop filter 206 included in the second phase-locking loop 200 controls the voltage controlled oscillator 202 in accordance with results of phase comparison delivered out of the phase comparator 205.

The microwave band frequency synthesizer constructed as above operates as will be described below. The output signal of a frequency fr (MHz) generated from the highly stable, low-noise reference crystal oscillator 1 is $1/n_1$ frequency divided at the fixed frequency divider 101 to provide a reference comparison frequency fr1 (MHz) for the first phaselocking loop 100. Thus, $fr1 = fr/n_1$ stands. The output signal of a frequency fv1 (MHz) from the voltage controlled oscillator 102 included in the first phaselocking loop 100 is N multiplied at the multiplier 103 to provide a frequency signal N·fv1 (MHz), and the multiplied reference signal of a frequency fs (MHz) of multiplied reference signal source 2 which is obtained by multiplication or phase-locked multiplication of the output signal of the reference crystal oscillator 1 is also N multiplied at the multiplier 105 to provide a frequency signal N·fs (MHz). The two frequency signals are subjected to mixing subtraction at the mixing subtracter 104, of which the output signla is $1/n_2$ frequency divided at the variable frequency divider 106 with variable frequency division coefficient n2 and applied via the phase comparator 107 to the loop filter 108 which makes the voltage controlled oscillator 102 phase locked. Under this condition, the relation $$N \cdot fv1 - N \cdot fs = n_2 fr1 \qquad (1)$$

stands. Equation (1) is reduced to $fv1 = (fr1/N) \cdot n_2 + fs$, indicating that as the variable frequency division coefficient n2 changes by 1 (one), the frequency of the voltage controlled oscillator 102 changes by a unit frequency change width which is $1/N$ of the comparison frequency fr1 for the loop. In other words, the comparison frequency for the loop is raised to a value being a multiplying coefficient N times the unit frequency change width of the voltage controlled oscillator 102 which takes place when the variable frequency division coefficient changes by one and the natural frequency $\omega n$ of the loop can therefore be maintained at a high level.

The mixing subtracter 109 for performing mixing subtraction of the output signals of the voltage controlled oscillator 102 and multiplied reference signal source 2 sets up the relation given by $$fv1 - fs = (fr1/N) \cdot n_2 \qquad (2)$$

which is equivalent to equation (1), indicating that there is produced from the first phase-locking loop 100 a signal whose frequency changes with the variable frequency division coefficient by the unit frequency change width of the voltage controlled oscillator 102.

This output signal of the first phase-locking loop is $1/n_3$ frequency divided at the fixed frequency divider 201 to provide a signal of a frequency fr2 (MHz) used as a reference comparison frequency for the second phase-locking loop 200. The output signal of a frequency fv2 (MHz) from the voltage controlled oscillator 202 and a frequency signal fL (MHz) of the fixed phase-locked oscillator 3 provided externally of the loop 200 are subjected to mixing subtraction at the mixing subtracter 203, of which the output signal is $1/n_3$ frequency divided at the fixed frequency divider 204, phase compared at the phase comparator 205 and applied to the loop filter 206 which makes the voltage controlled oscillator 202 phase locked. Under this condition, the relation $$(fr1/N) \cdot n_2 = fL - fv2 = n_3 fr2 \qquad (3)$$

is obtained. When the frequencies fr1 and fr2 are so selected as to satisfy $fr1 < fr2$, the leakage/spurious characteristics at the comparison frequency in the first phase-locking loop 100 can be improved by means of the second phase-locking loop 200. While the comparison frequency fr1 of the first phase-locking loop 100 is constant and frequency setting is changed by changing the frequency division coefficient of the variable frequency divider 106, the comparison frequency of the second phase-locking loop 200 is frequency divided at the fixed frequency divider 204 so as to be simply decreased and therefore its value changes depending on the frequency setting. Ultimately, the output signal of the second phase-locking loop 200, i.e., the output signal of the voltage controlled oscillator 202 is M multiplied at the multiplier 4 to provide a signal of the microwave band frequency synthesizer per se.

As described above, according to the present embodiment, the leakage/spurious characteristics at the comparison frequency in the first phase-locking loop 100 can be improved by means of the second phase-locking loop 200 for which the comparison frequency can be selected to be high and the output signal of the second phase-locking loop 200 prior to the M multiplication at the multiplier 4 for obtaining the microwave band frequency synthesizer signal is made identical to the output signal of the voltage controlled oscillator 202 with advantage from the standpoint of output signal level and spurious characteristics.

In the present embodiment, the frequency of the frequency synthesizer can be changed stepwise in the microwave band through $(fr1/N) \times M$ as is clear from the foregoing description. This means that the degree of freedom can be increased by having the chance of selecting fr1, N and M, as compared to the case where no multiplier is included in the first phase-locking loop 100 and only N=1 is valid.

Figure 2:
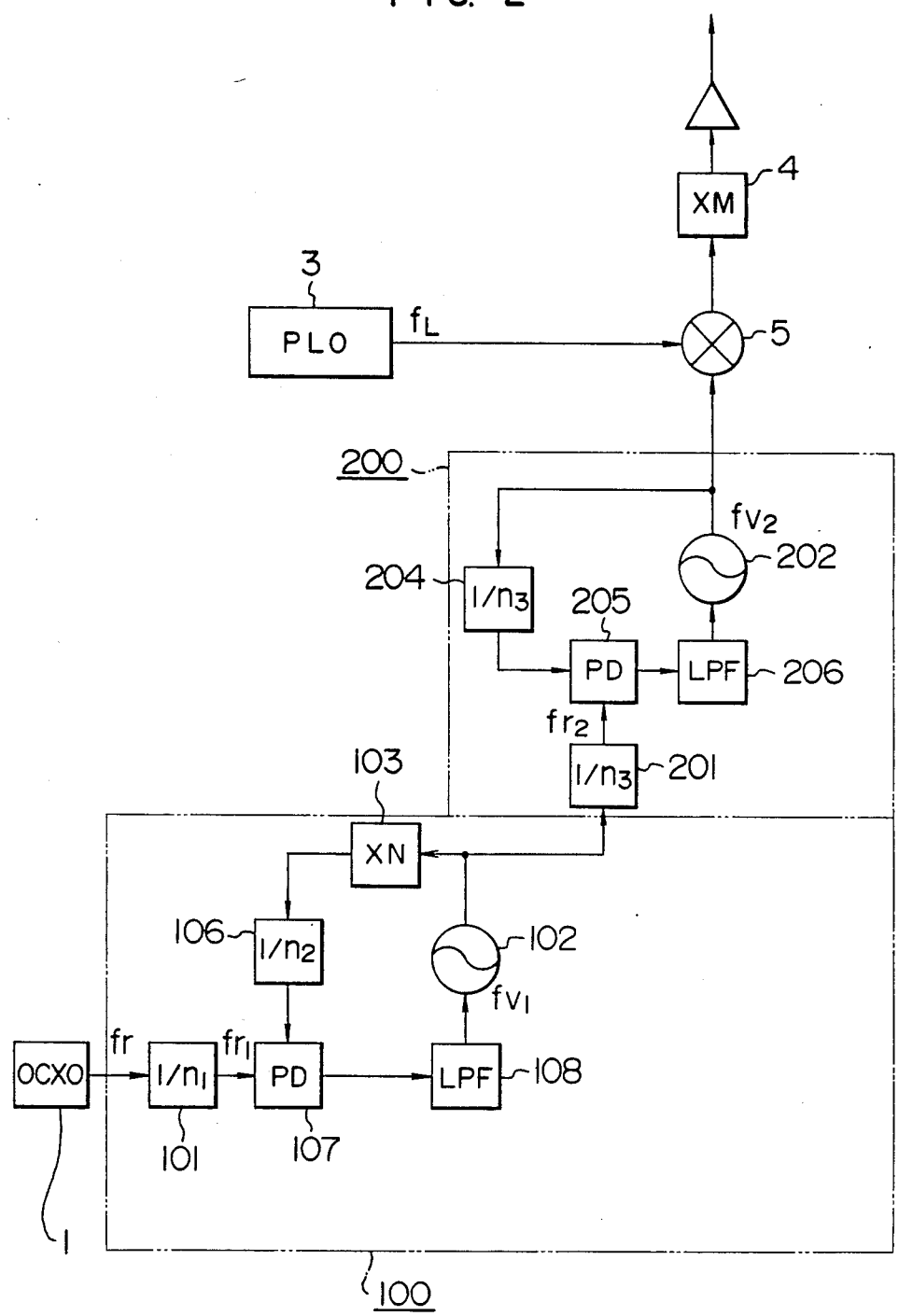

Referring now to FIG. 2, there is illustrated in schematic circuit diagram form, a second embodiment of microwave band frequency synthesizer according to the invention. As shown in FIG. 2, a microwave band frequency synthesizer basically comprises a highly stable reference crystal oscillator 1, a fixed phase-locked oscillator 3 operative to generate an oscillation signal of fixed phase, a first phase-locking loop 100, a second phase-locking loop 200, a mixing adder 5 for performing mixing addition of output signals of the fixed phase-locked oscillator 3 and second phase-locking loop 200, and a multiplier 4 adapted to M multiply an output signal of the mixing adder 5.

In particular, the first phase-locking loop 100 includes a fixed frequency divider 101 for performing fixed frequency division by $1/n_1$ of a reference signal delivered out of the reference crystal oscillator 1, a voltage controlled oscillator 102 operative to generate an oscillation signal in accordance with a control potential of a loop filter 108 to be described later, a multiplier 103 adapted to N multiply the oscillation frequency of the output signal of the voltage controlled oscillator 102, a variable frequency divider 106 for performing variable frequency division by $1/n_2$ of an outut signal of the multiplier 103, and a phase comparator 107 for performing phase comparison between output signals of the fixed frequency divider 101 and variable frequency divider 106. The loop filter 108 included in the first phase-locking loop 100 is responsive to an output signal of the phase comparator 107 to control the oscillation of the voltage controlled oscillator 102.

The second phase-locking loop 200, on the other hand, includes a fixed frequency divider 201 for performing fixed frequency division by $1/n_3$ of the output signal of the voltage controlled oscillator 102 included in the first phase-locking loop 100, a voltage controlled oscillator 202 operative to generate an oscillation signal in accordance with a control signal of a loop filter 206 to be described later, a fixed frequency divider 204 for performing fixed frequency division by $1/n_3$ of the output signal of the voltage controlled oscillator 202, and a phase comparator 205 for performing phase comparison between output signals of the fixed frequency dividers 201 and 204. The loop filter 206 included in the second phase-locking loop 200 controls the voltage controlled oscillator 202 in accordance with results of phase comparison delivered out of the phase comparator 205.

The microwave band frequency synthesizer constructed as above operates as will be described below. The output signal of a frequency fr (MHz) generated from the highly stable, low-noise reference crystal oscillator 1 is $1/n_1$ frequency divided at the fixed frequency divider 101 to provide a reference comparison frequency fr1 (MHz) for the first phase-locking loop 100. Thus, $fr1 = fr/n_1$ stands. The output signal of a frequency fv1 (MHz) from the voltage controlled oscillator 102 included in the first phase-locking loop 100 is N multiplied at the multiplier 103 to provide a frequency signal N·fv1 (MHz). This signal is $1/n_2$ frequency divided at the variable frequency divider 106 with variable frequency division coefficient n2 and applied via the phase comparator 107 to the loop filter 108 which makes the voltage controlled oscillator 102 phase locked. Under this condition, the relation $$N \cdot fv1 = n_2 fr1 \quad (4)$$

stands. Equation (4) is reduced to $fv1 = (fr1/N) \cdot n_2$, indicating that as the variable frequency division coefficient $n_2$ changes by one, the frequency of the voltage controlled oscillator 102 changes by 1/N of the comparison frequency fr1 for the loop. In other words, the comparison frequency for the loop is raised to a value being a multiplying coefficient N times the frequency change width of the voltage controlled oscillator 102 which takes place when the variable frequency division coefficient changes by one and the natural frequency $\omega n$ of the loop can therefore be maintained at a high level. The output signal of the voltage controlled oscillator 102 is $1/n_3$ frequency divided at the fixed frequency divider 201 to provide a signal of a frequency fr2 (MHz) used as a reference comparison frequency for the second phase-locking loop 200. The output signal of a frequency fv2 (MHz) from the voltage controlled oscillator 202 is $1/n_3$ frequency divided at the fixed frequency divider 204, of which the output signal is subjected to phase comparison at the phase comparator 205 and applied to the loop filter 206 which makes the voltage controlled oscillator 202 phase locked. Under this condition, the relation $$(fr1/N) \cdot n_2 = n_3 fr2 \quad (5)$$

is obtained. When the frequencies fr1 and fr2 are so selected as to satisfy fr1 < fr2, the leakage/spurious characteristics at the comparison frequency in the first phase-locking loop 100 can be improved by means of the second phase-locking loop 200. While the comparison frequency fr1 of the first phase-locking loop 100 is constant and frequency setting is changed by changing the frequency division coefficient of the variable frequency divider 106, the comparison frequency of the second phase-locking loop 200 is frequency divided at the fixed frequency divider 204 so as to be simply decreased and therefore its value changes depending on the frequency setting. Ultimately, the output signal of the second phase-locking loop 200, i.e., the output signal of the voltage controlled oscillator 202 and an output signal of a frequency fL of the low-noise fixed phase-locked oscillator 3 provided externally of the loop 200 are subjected to mixing addition at the mixing adder 5 and the output signal, raised in frequency, of the mixing adder 5 is M multiplied at the multiplier 4 to provide a signal of the microwave band frequency synthesizer per se.

As is clear from the foregoing description, according to this second embodiment, the leakage/ spurious characteristics at the comparison frequency in the first phase-locking loop 100 can be improved by means of the second phase-locking loop 200 for which the comparison frequency can be selected to be high and in addition, the fixed phase-locked oscillator 3 is easy to be of low noise because of the fixed frequency and the voltage controlled oscillators 102 and 202 respectively included in the first and second phase-locking loops 100 and 200 can operate at low frequencies because the mixing addition is adapted for raising the frequency, thereby making it easy to provide a low-noise frequency synthesizer.

In the second embodiment, the frequency of the frequency synthesizer can also be changed stepwise in the microwave band through (fr1/N)×M as is clear from the foregoing description. This means that the degree of freedom can be increased by having the chance of selecting fr1, N and M, as compared to the case where no multiplier is included in the first phase-locking loop 100 and only N=1 is valid.

Figure 3:
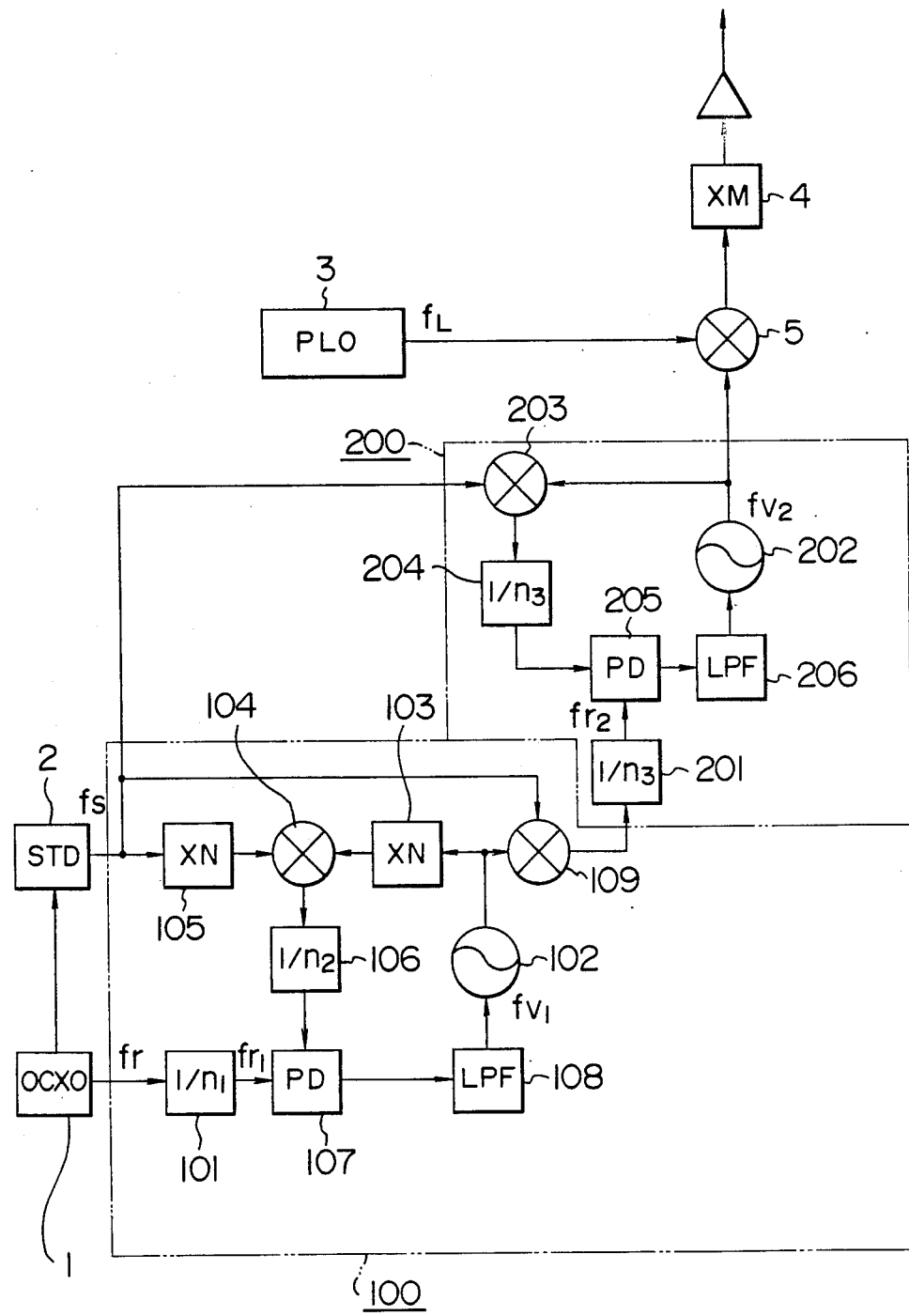

Turning now to FIG. 3, there is illustrated, in schematic circuit diagram form, a third embodiment of microwave band frequency synthesizer according to the invention. As shown in FIG. 3, a microwave band frequency synthesizer basically comprises a highly stable reference crystal oscillator 1, a multiplied reference signal source 2 adapted to multiply a reference signal of the reference crystal oscillator 1, a fixed phase-locked oscillator 3 operative to generate an oscillation signal of fixed phase, a first phase-locking loop 100, a second phase-locking loop 200, a mixing adder 5 for performing mixing addition of output signals of the fixed phase-locked oscillator 3 and second phase-locking loop 200, and a multiplier 4 adapted to M multiply an output signal of the mixing adder 5.

In particular, the first phase-locking loop 100 includes a fixed frequency divider 101 for performing fixed frequency division by $1/n_1$ of a reference signal delivered out of the reference crystal oscillator 1, a voltage controlled oscillator 102 operative to generate an oscillation signal in accordance with a control potential of a loop filter 108 to be described later, a multiplier 103 adapted to N multiply the oscillation frequency of the output signal of the voltage controlled oscillator 102, a mixing subtracter 104 for performing mixing subtraction of an output signal of a multiplier 105, adapted to N multiply an output signal of the multiplied reference signal source 2, and an output signal of the multiplier 103, a variable frequency divider 106 for performing variable frequency division by $1/n_2$ of an output signal of the mixing subtracter 104, a phase comparator 107 for performing phase comparison between output signals of the fixed frequency divider 101 and variable frequency divider 106, and a mixing subtracter 109 for performing mixing subtraction of the output signals of the voltage controlled oscillator 102 and multiplied reference signal source 2. The loop filter 108 included in the first phase-locking loop 100 is responsive to an output signal of the phase comparator 107 to control the oscillation of the voltage controlled oscillator 102. The second phase-locking loop 200, on the other hand, includes a fixed frequency divider 201 for performing fixed frequency division by $1/n_3$ of an output signal of the mixing subtracter 109 included in the first phase-locking loop 100, a voltage controlled oscillator 202 operative to generate an oscillation signal in accordance with a control signal of a loop filter 206 to be described later, a mixing subtracter 203 for performing mixing subtraction of the output signals of the voltage controlled oscillator 202 and multiplied reference signal source 2, a fixed frequency divider 204 for performing fixed frequency division by $1/n_3$ of an output signal of the mixing subtracter 203, and a phase comparator 205 for performing phase comparison between output signals of the fixed frequency dividers 201 and 204. The loop filter 206 included in the second phase-locking loop 200 controls the voltage controlled oscillator 202 in accordance with results of phase comparison delivered out of the phase comparator 205.

The microwave band frequency synthesizer constructed as above operates as will be described below. The operation of the first phase-locking loop 100 is quite the same as in the case of the first embodiment. More particularly, the output signal of a frequency fr (MHz) generated from the highly stable, low-noise reference crystal oscillator 1 is $1/n_1$ frequency divided at the fixed frequency divider 101 to provide a reference comparison frequency fr1 (MHz) for the first phase-locking loop 100. Thus, $fr1 = fr/n_1$ stands. The output signal of a frequency fv1 (MHz) from the voltage controlled oscillator 102 included in the first phase-locking loop 100 is N multiplied at the multiplier 103 to provide a frequency signal N·fv1 (MHz), and the multiplied reference signal of a frequency fs (MHz) of multiplied reference signal source 2 which is obtained by multiplication or phase-locked multiplication of the output signal of the reference crystal oscillator 1 is also N multiplied at the multiplier 105 to provide a frequency signal N·fs (MHz). The two frequency signals are subjected to mixing subtraction at the mixing subtracter 104, of which the output signal is $1/n_2$ frequency divided at the variable frequency divider 106 with variable frequency division coefficient n2 and applied via the phase comparator 107 to the loop filter 108 which makes the voltage controlled oscillator 102 phase locked. Under this condition, the relation $$N \cdot fv1 - N \cdot fs = n_2 fr1 \qquad (6)$$

stands. Equation (6) is reduced to $fv1 = (fr1/N) \cdot n_2 + fs$, indicating that as the variable frequency division coefficient n2 changes by one, the frequency of the voltage controlled oscillator 102 changes by a unit frequency change width which is 1/N of the comparison frequency fr1 for the loop. In other words, the comparison frequency for the loop is raised to a value being a multiplying coefficient N times the unit frequency change width of the voltage controlled oscillator 102 which takes place when the variable frequency division coefficient changes by one and the natural frequency ωn of the loop can therefore be maintained at a high level.

The mixing subtracter 109 for performing mixing subtraction of the output signal of the voltage controlled oscillator 102 and the multiplied reference signal of the multiplied reference signal source 2 sets up the relation given by $$fv1 - fs = (fr1/N) \cdot n_2 \qquad (7)$$

which is equivalent to equation (6), indicating that there is produced from the first phase-locking loop 100 a signal whose frequency changes with the variable frequency division coefficient by the unit frequency change width of the voltage controlled oscillator 102.

This output signal of the first phase-locking loop is $1/n_3$ frequency divided at the fixed frequency divider 201 to provide a signal of a frequency fr2 (MHz) used as a reference comparison frequency for the second phase-locking loop 200. The output signal of a frequency fv2 (MHz) from the voltage controlled oscillator 202 and the multiplied reference signal of fs (MHz) frequency from the multiplied reference signal source 2 are subjected to mixing subtraction at the mixing subtracter 203, of which the output signal is $1/n_3$ frequency divided at the fixed frequency divider 204, phase compared at the phase comparator 205 and applied to the loop filter 206 which makes the voltage controlled oscillator 202 phase locked. Under this condition, the relation $$(fr1/N) \cdot n_2 = fs - fv2 = n_3 fr2 \qquad (8)$$

is obtained. When the frequencies fr1 and fr2 are so selected as to satisfy fr1<fr2, the leakage/spurious characteristics at the comparison frequency in the first phase-locking loop 100 can be improved by means of the second phase-locking loop 200. As in the first and second embodiments while the comparison frequency fr1 of the first phase-locking loop 100 is constant and frequency setting is changed by changing the frequency division coefficient of the variable frequency divider 106, the comparison frequency of the second phase-locking loop 200 is frequency divided at the fixed frequency divider 204 so as to be simply decreased and therefore its value changes depending on the frequency setting. Ultimately, the output signal of the second phase-locking loop 200, i.e., the output signal of the voltage controlled oscillator 202 and an output signal of a frequency fL of the low-noise fixed phase-locked oscillator 3 are subjected to mixing addition at the mixing adder 5 and the output signal, raised in frequency, of the mixing adder 5 is M multiplied at the multiplier 4 to provide a signal of the microwave band frequency synthesizer per se.

As is clear from the foregoing description, according to this third embodiment, the leakage/spurious characteristics at the comparison frequency in the first phase-locking loop 100 can be improved by means of the second phase-locking loop 200 for which the comparison frequency can be selected to be high and in addition, the fixed phase-locked oscillator 3 is easy to be of low noise because of the fixed frequency and the voltage controlled oscillators 102 and 202 respectively included in the first and second phase-locking loops 100 and 200 can operate at low frequencies because the mixing addition is adapted for raising the frequency, thereby making it easy to provide a low-noise frequency synthesizer.

Further, the mixing subtracters 104 and 203 are used in the first and second phase-locking loops 100 and 200, respectively, for the purpose of lowering the frequency and hence even when the frequency of the voltage controlled oscillators 102 and 202 is high, the variable frequency divider 106 and fixed frequency divider 204 can be operated with a small frequency division coefficient necessary for attaining low noise.

Moreover, as in the first and second embodiments, the frequency of the frequency synthesizer can also be changed stepwise in the microwave band through (fr1/N)×M as is clear from the foregoing description. This means that the degree of freedom can be increased by having the chance of selecting fr1, N and M, as compared to the case where no multiplier is included in the first phase-locking loop 100 and only N=1 is valid.

Figure 4:
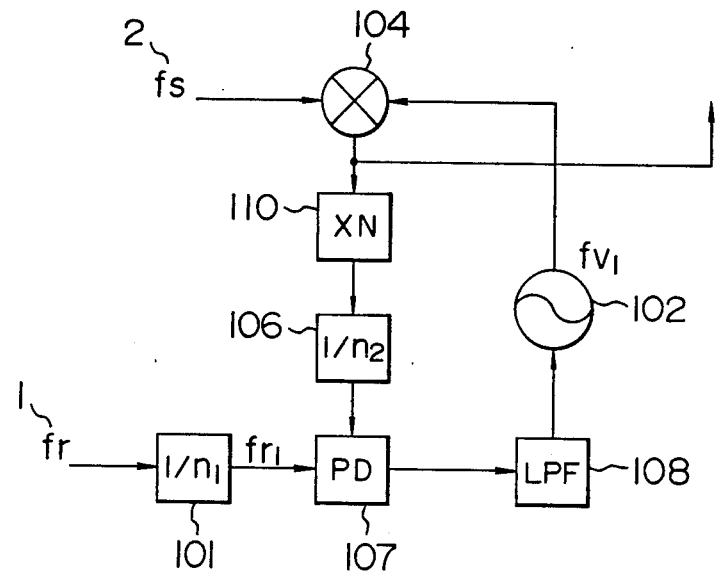
FIGS. 4 and 5 are schematic circuit diagrams showing embodiments of the essential parts of the FIGS. 1 to 3 frequency synthesizers.

A fourth embodiment of the invention will now be described. FIG. 4 is a schematic circuit diagram showing a first phase-locking loop according to the fourth embodiment of the invention. This loop of FIG. 4 may be used as substitution for the correponding part of the frequency synthesizers shown in FIGS. 1, 2 and 3.

The fourth embodiment of FIG. 4 is different from, for example, the FIG. 3 embodiment in that the output signals of the voltage controlled oscillator 102 and multiplied reference signal source 2 are first subjected to mixing subtraction at the mixing subtracter 104 and thereafter the output signal of the mixing subtracter 104 is N multiplied at a multiplier 110, and that the output signal of the first phase-locking loop 100 is delivered out of the output of the mixing subtracter 104.

The loop of the fourth embodiment constructed as above operates in substantially the same way as that of the third embodiment with the only exception that because of the multiplication following the lowering of the frequency through the mixing subtraction, the FIG. 4 loop can be used only for a narrow band frequency synthesizer wherein higher harmonics of the order which is lower than N times the output signal frequency of the mixing subtracter 104 do not fall within the input frequency range of the variable frequency divider 106. Thus, the fourth embodiment can provide a narrow-band, low-noise and low spurious microwave band frequency synthesizer by using a more simplified construction.

Figure 5:
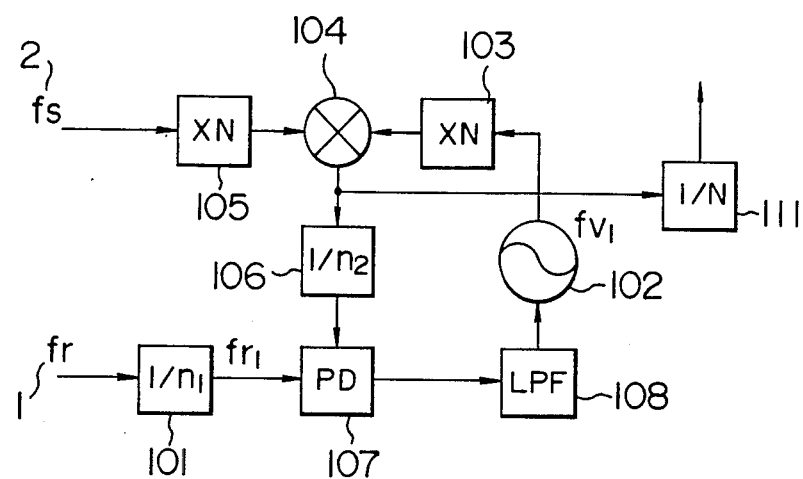

A fifth embodiment of the invention will now be described. FIG. 5 is a schematic circuit diagram showing a first phase-locking loop according to the fifth embodiment of the invention. This loop of FIG. 5 may also be used as substitution for the corresponding part of the frequency synthesizers shown in FIGS. 1, 2 and 3.

The fifth embodiment of FIG. 5 is different from, for example, the FIG. 3 embodiment in that the output signal of the first phase-locking loop 100 is delivered out of the output of the mixing subtracter 104 and frequency divided at a frequency divider 111 by the same order as that of the multipliers 103 and 105, that is, by 1/N.

The loop of the fifth embodiment constructed as above operates in substantially the same way as that of the third embodiment with the only exception that because of the replacement of the mixing subtracter 109 in the third embodiment with the frequency divider 111, the 1/N frequency divided output signal has a frequency given by $$(Nfv1 - Nfs)/N = fv1 - fs \tag{9}$$

This output signal frequency is identical to the output frequency from the mixing subtracter 109 of the third embodiment which is given by equation (7).

As described above, according to this fifth embodiment, the output signal of the first phase-locking loop can be delivered out of the frequency divider substituting for the mixing subtracter 109 as far as the influence of noise due to the frequency division of the frequency divider 111 is less degrading and besides, a frequency divider for $1/(n_3 \cdot N)$ frequency division can be used which substitutes for the combination of the mixing subtracter 109 and the fixed frequency divider 201 in the third embodiment, thereby making it possible to provide a low-noise and low spurious microwave band frequency synthesizer by using a more simplified construction.

We claim:

1. A microwave band frequency synthesizer comprising:
   a first phase-locking loop including a first voltage controlled oscillator, a variable frequency divider and a first multiplier and generating an output signal whose frequency changes at the rate of a unit frequency change width of said first voltage controlled oscillator;
   a second phase-locking loop including a first fixed frequency divider for performing fixed frequency division of the output signal of said first phase-locking loop to provide a phase comparison reference signal of a frequency higher than that phase-compared in said first phase-locking loop, a second voltage controlled oscillator, a second fixed frequency divider for performing fixed frequency division of an output signal of said second voltage controlled oscillator, a second phase comparator for performing phase comparison between a frequency division output signal of said second fixed frequency divider and said phase comparison reference signal to provide a signal for phase locking said second voltage controlled oscillator; and a second multiplier for multiplying an output signal from said second voltage controlled oscillator to provide a microwave band signal

* * * * *